(12) United States Patent
Chen et al.

(10) Patent No.: US 6,905,811 B2
(45) Date of Patent: Jun. 14, 2005

(54) METHOD TO FORM REDUCED DIMENSION PATTERN WITH GOOD EDGE ROUGHNESS

(75) Inventors: Chao Peng Chen, Fremont, CA (US); Chunping Luo, Milpitas, CA (US); Stuart Kao, Fremont, CA (US); Jei-Wei Chang, Cupertino, CA (US)

(73) Assignee: Headway Technologies, Inc., Milpitas, CA (US)

( * ) Notice: Subject to any disclaimer, the term of this patent is extended or adjusted under 35 U.S.C. 154(b) by 176 days.

(21) Appl. No.: 10/420,593

(22) Filed: Apr. 22, 2003

(65) Prior Publication Data

US 2004/0214109 A1 Oct. 28, 2004

(51) Int. Cl.⁷ .................................................. G03F 7/00
(52) U.S. Cl. ................................................... 430/296
(58) Field of Search .................... 430/311–313, 296, 430/942, 394

(56) References Cited

U.S. PATENT DOCUMENTS

| | | | |
|---|---|---|---|
| 4,568,601 A | 2/1986 | Araps et al. | 428/167 |
| 6,150,070 A * | 11/2000 | Minter et al. | 430/296 |
| 6,218,090 B1 | 4/2001 | Minter et al. | 430/394 |
| 6,313,492 B1 | 11/2001 | Hakey et al. | 257/296 |
| 6,436,810 B1 | 8/2002 | Kumar et al. | 438/633 |
| 6,566,274 B1 * | 5/2003 | Jacot et al. | 438/739 |
| 6,774,043 B2 * | 8/2004 | Yamaguchi et al. | 438/705 |
| 2001/0004765 A1 | 6/2001 | Miyagawa | |
| 2003/0235779 A1 * | 12/2003 | Hatakeyama et al. | 430/270.1 |

OTHER PUBLICATIONS

L. Pain, et al.,"Bake Condition Effect on Hybrid Lithography Process for Negative Tone Chemically Amplified Resists," Proc. SPIE , vol. 3999 (2000) , pp. 706–716.

A. G. Timko, et. al., Linewidth Reduction Using Liquid Ashing for sub– 100 nm Critical Dimension with 248 nm Lithography. J.Vac.Sci. Technol. B 19(6), Nov/Dec. 2001, pp. 2713–2716.

B. Wu et al. ,"Energy Deposition and Transfer in Electron–Beam Lithography," J. Vac. Sci. Technol. B 19(6), Nov./Dec 2001, pp. 2508–2511.

S. Yamamoto, et. al., Chemistry of Chemically Amplified Negative Resist and Process Modification for Electron Beam Exposure, Tech. Bulletin from Sumitamo Chemical Co. Ltd., Osaka , Japan.

* cited by examiner

*Primary Examiner*—Mark F. Huff
*Assistant Examiner*—Kripa Sagar
(74) *Attorney, Agent, or Firm*—George O. Saile; Stephen B. Ackerman

(57) ABSTRACT

As feature sizes approach 0.1 $\mu$m or smaller, reduction of line edge roughness (LER) becomes increasingly important. Significant reductions in edge roughness have been achieved by applying a second Ebeam exposure after the initial one that is used to define the pattern. After this second blanket exposure a longer heat treatment and a stronger development process than before are used. In addition to reducing edge roughness the disclosed treatment allows the CD to be reduced under tight control since the amount of CD reduction is proportional to the second Ebeam dosage.

30 Claims, 2 Drawing Sheets

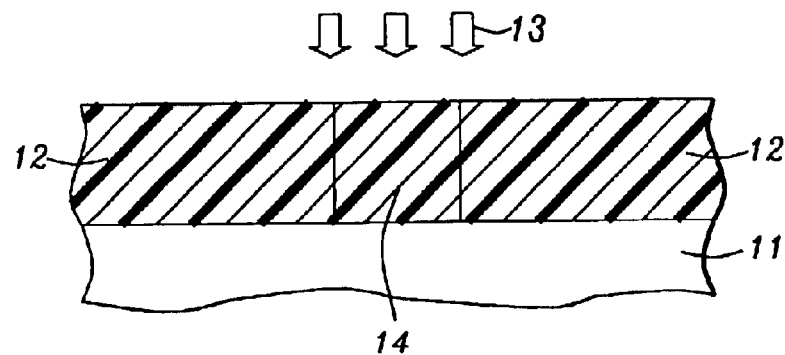
FIG. 1 – Prior Art
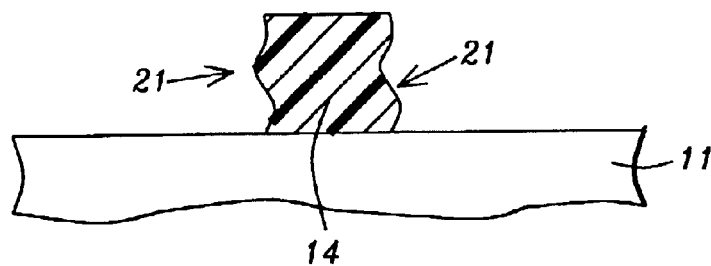
FIG. 2 – Prior Art
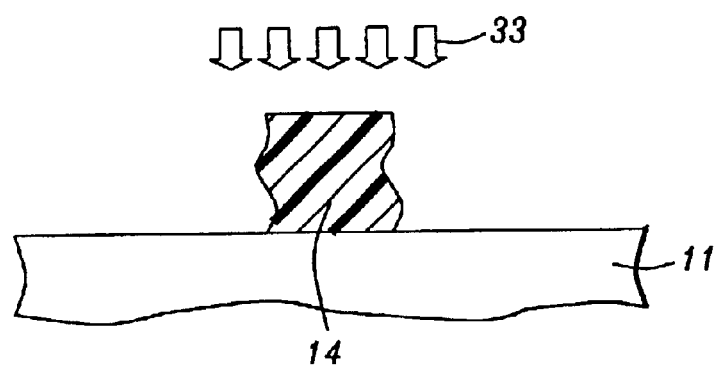
FIG. 3
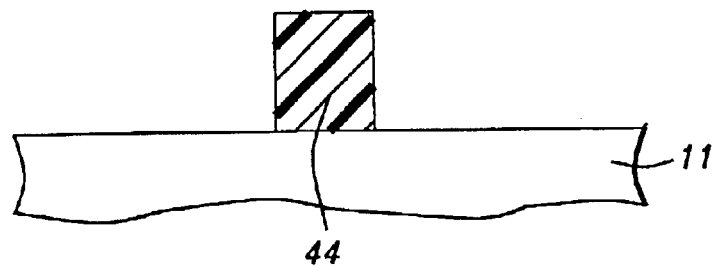
FIG. 4

METHOD TO FORM REDUCED DIMENSION PATTERN WITH GOOD EDGE ROUGHNESS

FIELD OF THE INVENTION

The invention relates to the general field of lithography with particular reference to control of line width and edge roughness after electron beam exposure.

BACKGROUND OF THE INVENTION

Negative-tone chemically amplified resists (NCAR) have been widely used in electron beam lithography for small dots or fine iso-lines. In general, NCAR, contains base resin, photo acid generator, curing agent, and additives such as a quencher. Referring now to FIG. 1, when NCAR 12 (on substrate 11) is exposed to an electron beam 13, a photo acid generator will release acid in exposed region 14, which will catalyze the cross-linking reaction of the base resin in the subsequent baking process. The degree of cross-linking will influence the dissolution rate of exposed NCAR allowing a resist pattern to be developed through the differential dissolution rates.

As the feature sizes approach 0.1 $\mu$m or smaller, reduction of line edge roughness (LER) becomes increasingly important. Many CD (critical dimension) reduction methods in the prior art do not have sufficient CD tolerance because LER has also increased substantially. In fact, LER can sometimes be greater than the total budget for CD tolerance. This is schematically illustrated in FIG. 2 where developed line 14 is seen to have rough edges 21. One can, in principle, always reduce the CD through extensive over-development since any incomplete or less cross-linked resists will be dissolved under aggressive development conditions. However, with such an approach, the LER also increases substantially. Additionally, the resist thickness also gets reduced.

Thus, the problem that the present invention addresses is how to precisely control line width in Ebeam resist patterns without an accompanying increase in line edge roughness and/or significant loss of thickness.

A routine search of the prior art was performed with the following references of interest being found:

In U.S. Pat. No. 6,313,492, Hakey et, al. show an e-beam process with negative and positive resists. In U.S. Pat. No. 4,568,601, Araps et al. show an e-beam exposure and curing method for negative resists. Kumar et al. show an e-beam exposure process in U.S. Pat. No. 6,436,810 B1. US 2001-004765A1 (Miyagawa) shows a double exposure e-beam process while Minter et al. reveal a double exposure e-beam process to control liftoff in U.S. Pat. No. 6,218,090 B1.

The following publications of interest are also noted:

1. L. Pain, et al, Proc. SPIE, Vol. 3999 (2000) pp. 706–716
2. A. G. Timko, et al, J. Vac. Sci. Technol. B 19(6) November/December 2001, pp. 2713–2716
3. B. Wu et al. J. Vac. Sci. Technol. B 19(6) November/December 2001, pp.2508–2511
4. S. Yamamoto, et al, Technical bulletin from Sumitomo Chemical Co. Ltd., Osaka, Japan

SUMMARY OF THE INVENTION

It has been an object of at least one embodiment of the present invention to provide a process for transferring a line pattern image into a resist layer.

Another object of at least one embodiment of the present invention has been that exposure of said resist be to an electron beam.

Still another object of at least one embodiment of the present invention has been that said line feature, after processing, have minimum edge roughness.

A further object of at least one embodiment of the present invention has been to provide a process for controlled CD reduction without an accompanying increase in edge roughness.

These objects have been achieved by applying a second Ebeam exposure after the initial one that is used to define the pattern. After this second blanket exposure a longer heat treatment and a stronger development process than before are used. Since the line is already formed at this point, fewer forward scattering electrons are generated at the edge of the resist features, so only edges will be dissolved in a concentrated developer. In addition to reducing edge roughness the disclosed treatment allows the CD to be reduced under tight control since the amount of CD reduction is proportional to the second Ebeam dosage.

BRIEF DESCRIPTION OF THE DRAWINGS

FIG. 1 illustrates the selective exposure of part of a resist layer to an electron beam.

FIG. 2 shows how, after development, the edge of a line feature is rough.

FIG. 3 illustrates application of a flooding dosage of electrons to the line feature of FIG. 2.

FIG. 4 shows how the feature of FIG. 2 appears after a second development step.

DESCRIPTION OF THE PREFERRED EMBODIMENTS

Figure 5:
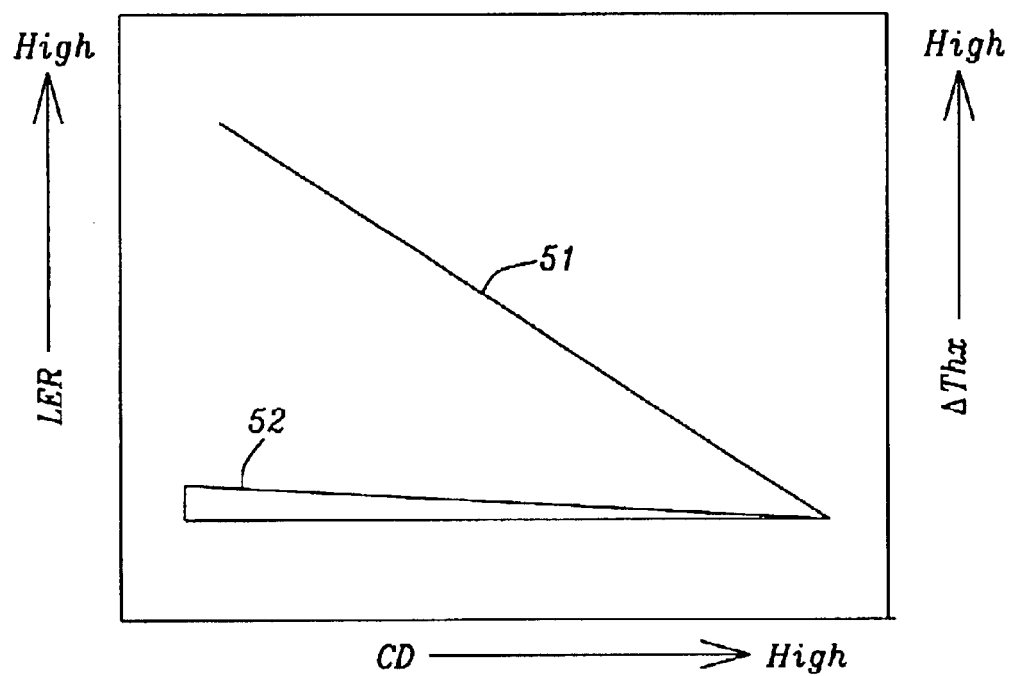
FIG. 5 compares plots of LER as a function of CD for the prior art and for the present invention.

In the present invention, we apply an extra Ebeam exposure to provide further curing of the developed resist. The disclosed CD-slimming process incorporates additional E-beam exposure, post exposure bake, and resist development steps to the conventional process. Since fewer forward scattering electrons are generated at the edge of resist features, the edge resists will have less degree of cross-linking as compared to the bulk resists. Therefore, only edge resists will be dissolved in the concentrated developer. The disclosed dimension-slimming process allows us to preserve the feature shape without reducing resist thickness or increasing its LER.

Referring once more to FIG. 1, the process of the present invention begins with providing substrate 11 and then coating with layer of resist 12. Under software control, resist layer 12 is then selectively exposed to electron beam 13 so that region 14 becomes polymerized, as described above, thereby forming a latent image, in this example of a line pattern. This is followed by a first heat treatment of the exposed resist, typically heating at a temperature between about 90 and 110° C. for between about 1 and 5 minutes in atmospheric air.

Resist layer 12 is now developed (the first such of two). Time to develop was for between about 1 and 120 seconds and the developing solution had a concentration of developer agent, such as tetramethylammonium hydroxide (TMAH) or KOH that was between about 0.05 and 0.5 normal. The result, as shown in FIG. 2 was developed line 14 which, as noted earlier, has line edge roughness 21. At this stage a typical value for the edge roughness would be between about 10 and 15 nm. Also, at this stage the line pattern had a minimum width of between about 0.09 and 0.15 microns.

Then, as a key feature of the invention, developed resist layer 14 is flood exposed to electron beam 33, as shown in FIG. 3. A typical such flood exposure would provide an electron beam dosage of between about 5 and 50 $\mu C/cm^2$. This is followed by a second heat treatment (between about 60 and 300 seconds at between about 90 and 110° C.) which is always longer than the earlier heat treatment. Next is the second development step which is for between about 1 and 120 seconds, always for longer than the first development time period, in a developing solution in which the concentration of developer agent is greater than it was for the first developing solution (typically between about 0.05 and 0.5 norml.

When the above procedure is followed, the result is line pattern 44, as shown in FIG. 4. This has a smaller minimum width than the original line 14 from which it derived (typically between about 0.07 and 0.13 microns) and is now largely clear of LER problems. (which now range from between about 8 to about 10 nm LER). Additionally, the change in the thickness of the resist layer was minimal. Typically, starting with a resist thickness of between about 200 and 300 nm, at the conclusion of the full process the thickness was still between about 200 and 300 nm.

Figure 6:
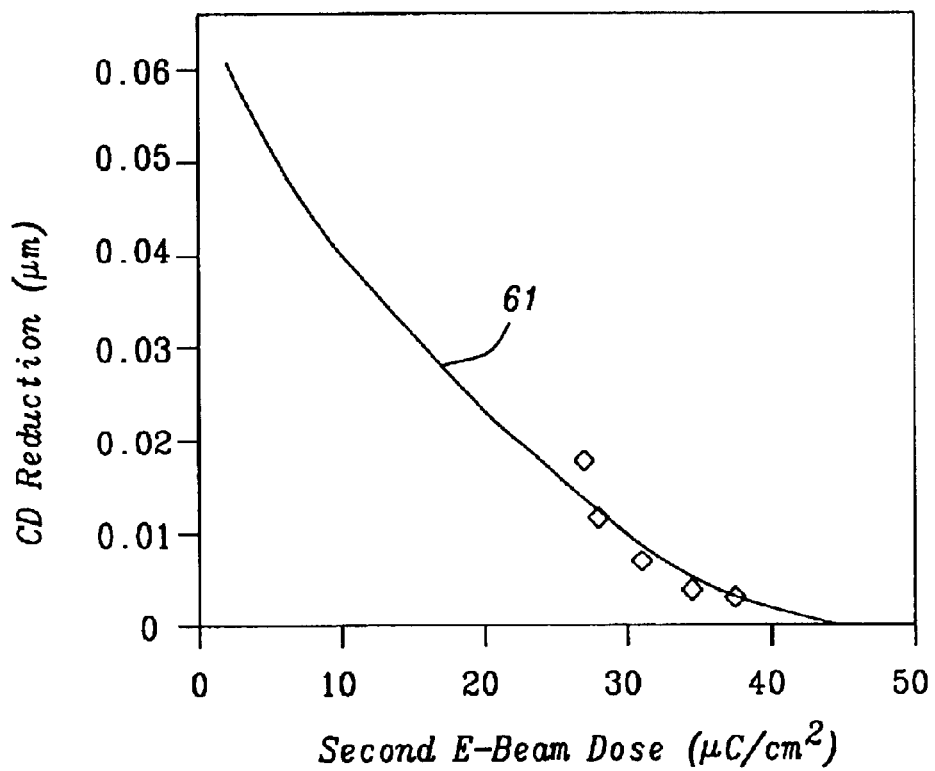
FIG. 6 is a plot of CD reduction as function of the second Ebeam dose.

The process of the present invention thus has two desirable outcomes:

(i) The removal of LER as confirmed in the data shown in FIG. 5. Curve 51 shows how, as the CD is reduced, LER necessarily rises when prior art processes are used. Curve 52 is for LER as a function of CD for the present invention and, as can be seen, there is vet little increase in LER as CD drops. For example, the standard deviation of feature CD of the disclosed process was 3.94 nm, which is very close to the 3.10 nm that was obtained by the regular E-beam process. In contrast, the sigma was 13.16 nm for lines produced using prior art methods such as the lashing process which uses only a single E-beam exposure (ii) The CD reduction that accompanies the elimination of LER is found to be proportional to the second (flood) exposure by the electron beam. This is shown in curve 61 of FIG. 6 which plots the amount of CD reduction as a function of the flooding Ebeam dose. From this data it can be seen that there will be an approximately 1 nm of line width reduction for each $\mu C/cm^2$ of electron dosage. In one specific example, a CD reduction of 2.1 nm resulted when a flood dosage of 26 $\mu C/cm^2$ was used.

What is claimed is:

1. A process to reduce edge roughness in a resist pattern, comprising:

coating a substrate with a layer of said resist;

under software control, selectively exposing said resist to an electron beam thereby forming a latent image, including a line pattern, in said resist layer;

then subjecting said resist layer to a first heat treatment;

for a first time period, performing a first development of said resist layer in a developing solution that has a first concentration of developer agent;

flood exposing said first developed resist layer to an electron beam;

then subjecting said resist layer to a second heat treatment; and for a second time period, that exceeds said first time period, performing a second development of said resist layer in a developing solution having a second concentration of developer agent, said second concentration being greater than said first concentration.

2. The process described in claim 1 wherein said resist is a negative tone, chemically amplified resist.

3. The process described in claim 1 wherein said line pattern, after first development, has an edge roughness of between about 10 and 15 nm.

4. The process described in claim 1 wherein said line pattern, after first development, has a minimum width of between about 0.09 and 0.15 microns.

5. The process described in claim 1 wherein said line pattern, after second development, has an edge roughness of between about 8 and 10 nm.

6. The process described in claim 1 wherein said line pattern, after second development, has a minimum width of between about 0.07 and 0.13 microns.

7. The process described in claim 1 wherein said resist layer has a thickness between about 200 and 300 nm.

8. The process described in claim 1 wherein, during the step of selectively exposing said resist to an electron beam, said resist, where it is exposed to the beam, receives an electron beam dosage of between about 5 and 50 $\mu C/cm^2$.

9. The process described in claim 1 wherein, during the step of flood exposing said resist to an electron beam, said resist receives an electron beam dosage of between about 5 and 50 $\mu C/cm^2$.

10. The process described in claim 1 wherein said developer agent is TMAH or KOH.

11. The process described in claim 1 wherein said first concentration of developer agent is between about 0.05 and 0.5 normal.

12. The process described in claim 1 wherein said second concentration of developer agent is between about 0.05 and 0.5 normal.

13. The process described in claim 1 wherein said first heat treatment comprises heating at a temperature between about 90 and 110° C. for between about 1 and 5 minutes in atmospheric air.

14. The process described in claim 1 wherein said second heat treatment comprises heating at a temperature between about 90 and 110° C. for between about 1 and 5 minutes in atmospheric air.

15. The process described in claim 1 wherein said first time period for said first development process is between about 1 and 120 seconds.

16. The process described in claim 1 wherein said second time period for said second development process is between about 1 and 120 seconds.

17. A method to control minimum width of a line in a resist pattern, comprising:

coating a substrate with a layer of said resist;

under software control, selectively exposing said resist to an electron beam thereby forming a latent image, including a line pattern having a first minimum width, in said resist layer;

then subjecting said resist layer to a first heat treatment;

for a first time period, performing a first development of said resist layer in a developing solution that has a first concentration of developer agent;

flood exposing said first developed resist layer to an electron beam, thereby providing an electron dose;

then subjecting said resist layer to a second heat treatment; and for a second time period, that exceeds said first time period, performing a second development of said resist layer in a developing solution having a second concentration of developer agent, said second concentration being greater than said first concentration, thereby forming a line pattern in said resist, having a second minimum width, whereby the difference between said first and second minimum widths is proportional to said electron dose.

18. The method described in claim 17 wherein said resist is a negative tone, chemically amplified resist.

19. The method described in claim 17 wherein the difference between said first and second minimum widths is controlled by said electron dose according to a relationship that predicts approximately 1 nm in line width reduction for each $\mu C/cm^2$ of electron dosage.

20. The method described in claim 17 wherein said line pattern, after first development, has a minimum width of between about 0.09 and 0.15 microns.

21. The method described in claim 17 wherein said second minimum width is between about 0.07 and 0.13 microns.

22. The method described in claim 17 wherein said resist layer has a thickness between about 200 and 300 microns.

23. The method described in claim 17 wherein, during the step of selectively exposing said resist to an electron beam, said resist, where it is exposed to the beam, receives an electron beam dosage of between about 5 and 50 $\mu C/cm^2$.

24. The method described in claim 17 wherein said developer agent is TMAH or KOH.

25. The method described in claim 17 wherein said first concentration of developer agent is between about 0.05 and 0.5 normal.

26. The method described in claim 17 wherein said second concentration of developer agent is between about 0.05 and 0.5 normal.

27. The method described in claim 17 wherein said first heat treatment comprises heating at a temperature between about 90 and 110° C. for between about 1 and 5 minutes in atmospheric air.

28. The method described in claim 17 wherein said second heat treatment comprises heating at a temperature between about 90 and 110° C. for between about 1 and 5 minutes in atmospheric air.

29. The method described in claim 17 wherein said first time period for said first development process is between about 1 and 120 seconds.

30. The method described in claim 17 wherein said second time period for said second development process is between about 1 and 120 seconds.

* * * * *